US012054825B2

United States Patent
White et al.

(10) Patent No.: US 12,054,825 B2
(45) Date of Patent: Aug. 6, 2024

(54) BOTTOM FED SUBLIMATION BED FOR HIGH SATURATION EFFICIENCY IN SEMICONDUCTOR APPLICATIONS

(71) Applicant: Applied Materials, Inc., Santa Clara, CA (US)

(72) Inventors: Carl White, Gilbert, AZ (US); David Marquardt, Scottsdale, AZ (US); Mohith Verghese, Phoenix, AZ (US)

(73) Assignee: Applied Materials, Inc., Santa Clara, CA (US)

( * ) Notice: Subject to any disclaimer, the term of this patent is extended or adjusted under 35 U.S.C. 154(b) by 376 days.

(21) Appl. No.: 17/355,119

(22) Filed: Jun. 22, 2021

(65) Prior Publication Data

US 2022/0403512 A1    Dec. 22, 2022

(51) Int. Cl.
    *C23C 16/448*    (2006.01)

(52) U.S. Cl.
    CPC ...... *C23C 16/4481* (2013.01); *C23C 16/4482* (2013.01)

(58) Field of Classification Search
    CPC .. C23C 16/4481–4482; C23C 16/45563–4558
    See application file for complete search history.

(56) References Cited

U.S. PATENT DOCUMENTS

| | | | |
|---|---|---|---|
| 4,883,362 A | 11/1989 | Gartner et al. | |
| 5,377,429 A | 1/1995 | Sandhu et al. | |
| 8,309,173 B2 | 11/2012 | Tuominen et al. | |
| 9,593,416 B2 | 3/2017 | Fondurulia et al. | |
| 11,584,990 B2 * | 2/2023 | Marquardt | C23C 16/4481 |
| 11,773,485 B2 * | 10/2023 | Marquardt | C23C 16/4481 118/726 |
| 2005/0066893 A1 | 3/2005 | Soininen | |
| 2008/0014350 A1 * | 1/2008 | Carlson | C23C 16/4482 118/733 |
| 2010/0322604 A1 * | 12/2010 | Fondurulia | C23C 16/4481 392/451 |
| 2014/0224176 A1 * | 8/2014 | Rhee | C23C 16/4401 118/724 |
| 2015/0053134 A1 * | 2/2015 | Lee | C23C 16/45512 366/101 |

(Continued)

FOREIGN PATENT DOCUMENTS

| | | |
|---|---|---|
| EP | 2247769 B1 | 9/2011 |
| GB | 2151662 A | 7/1985 |

(Continued)

OTHER PUBLICATIONS

"Porous Metal Overview", Mott Corporation, 8 pages.

(Continued)

*Primary Examiner* — Aiden Lee
(74) *Attorney, Agent, or Firm* — Servilla Whitney LLC

(57) ABSTRACT

Ampoules for a semiconductor manufacturing precursors and methods of use are described. The ampoules include a container with an inlet port an outlet port, a manifold having a serpentine base creating a tortuous flow path and a filter media assembly in a bottom-fed configuration. The torturous flow path is defined by a plurality of elongate walls and a plurality of openings of the serpentine base ampoule, through which a carrier gas flows in contact with the precursor.

16 Claims, 9 Drawing Sheets

(56) References Cited

U.S. PATENT DOCUMENTS

2015/0191819 A1* 7/2015 Hendrix ............... C23C 16/455
118/728
2017/0137936 A1 5/2017 Birtcher et al.

FOREIGN PATENT DOCUMENTS

| JP | 2014009392 A | 1/2014 |
| KR | 101978398 B1 | 5/2019 |
| TW | I304998 B | 1/2009 |

OTHER PUBLICATIONS

Machine Translation of KR101978398, 26 pages.
Machine Translation of TWI304998, 17 pages.
PCT International Search Report and Written Opinion in PCT/US2022/034451 dated Oct. 4, 2022, 11 pages.

* cited by examiner

BOTTOM FED SUBLIMATION BED FOR HIGH SATURATION EFFICIENCY IN SEMICONDUCTOR APPLICATIONS

TECHNICAL FIELD

The present disclosure relates generally to ampoules and methods for using ampoules for semiconductor manufacturing precursors. In particular, the disclosure relates to ampoules and methods to provide bottom fed sublimation bed and tortuous flow path for low vapor pressure precursors.

BACKGROUND

The semiconductor industry is using an increasing variety of chemistries for chemical vapor deposition (CVD) and atomic layer deposition (ALD) processes that come in liquid or solid form. The precursor is typically inside a closed vessel or ampoule with a single inlet and a single outlet.

Solid precursors with a low vapor pressure frequently use a carrier gas to carry the vapor out of the ampoule to the process reactor. For these types of processes there are two types of ampoules typically used: a bubbler where the inlet carrier gas goes into a tube that is submerged into the precursor; and a cross-flow ampoule where the carrier gas sweeps headspace in the ampoule from the top. Often, there is only a very short flow path for the carrier gas. The short flow path from the inlet to the outlet of the vessel does not allow adequate residence time within the vessel to allow the carrier gas to become fully saturated with vaporized or sublimed precursor. Some existing ampoule designs do not evenly distribute the carrier gas across the entire surface of the precursor. Some existing ampoules designs do not provide adequate heating of the precursor within the entire vessel. Many other solid source ampoules do not provide a means for keeping precursor dust from traveling downstream where it hampers control valve performance or creates on-wafer particle issues.

Conventional top-fed sublimation architectures include an ampoule or canister partially filled with solid precursor, which rests on the bottom of the ampoule. As the ampoule is heated and carrier gas is introduced into the head space of the ampoule, sublimation occurs between the top surface of the solid precursor and the carrier gas within the head space. In an ideal scenario, the carrier gas flowing through the ampoule becomes saturated with the precursor. As the head space of the ampoule increases, resulting in varying concentrations of saturated carrier gas, an inconsistent dose of precursor-carrier gas is supplied. As such, carrier gas saturation is not maintained due to inefficiencies in the ampoule and solid precursor depletion.

There is a need in the art for ampoules, methods of making ampoules and/or methods of using ampoules with one or more of an increased flow path, increased surface area for sublimation and for consistent concentrations of saturated carrier gas.

SUMMARY

One or more embodiments are directed to an ampoule for a semiconductor precursor material having a torturous path for increased dwell time in a bottom-fed configuration. The ampoule comprises a container, a lid, a manifold inserted into the container and a filter media on which precursor material rests.

The container has a bottom wall and sidewalls defining a precursor cavity configured to hold the precursor material. The lid is in contact with the sidewalls and the lid has an inlet port and an outlet port extending through the lid. The manifold comprises a hollow cylindrical shaft with an outlet and a serpentine base positioned at a bottom end of the shaft, the serpentine base has a top surface and a bottom surface, the bottom surface has a plurality of elongate walls extend therefrom, each of the elongate walls having a plurality of openings in adjacent elongate walls off-set from one another forming a torturous flow path.

The filter media assembly is in contact with the bottom end of the shaft forming a sublimation cavity between a bottom surface of the filter media assembly and the top surface of the bottom wall, the sublimation cavity including the bottom end of the shaft and the serpentine base. An inlet conduit extends from the lid to the sublimation cavity, so that a gas flowing through the inlet conduit passes through the torturous path and out the outlet in the hollow cylindrical shaft.

In some embodiments, the precursor material rests on the filter media assembly such that depletion of solid precursor does not cause concentration variations within the sublimation cavity. The filter media assembly comprises a first filter media and a frame, the first filter media having a porosity such that vaporized precursor can pass through. The material is heated such that a vapor precursor is formed and flows through the filter media assembly and is mixed and sublimed with carrier gas.

In some embodiments, the ampoule further comprises a gas ring in fluid communication with the inlet port, the gas ring comprising a plurality of outlet holes configured to allow a carrier gas to pass through the gas ring. The gas ring positioned below the filter media assembly such that carrier gas is distributed across a bottom surface of the filter media assembly. In some embodiments the gas ring is connected to the inlet port by an inlet conduit, while in other embodiments the gas ring is integral to the bottom end of the shaft.

In some embodiments, the manifold further comprises a top wall having an integral inlet port in fluid communication with the hollow shaft and the gas ring, so that a carrier gas can pass through the shaft and out of the outlet holes and across the filter media assembly. In some embodiments, the outlet port is in fluid communication with a central cavity of the serpentine base, the central cavity bounded by an innermost wall of the plurality of walls, and the bottom wall of the container. In some embodiments, central cavity is in fluid communication with the outlet port via an outlet conduit and the outlet conduit is in fluid communication with an integral outlet port formed in the top wall of the manifold. In some embodiments, the central cavity is in direct communication with the hollow shaft such that gases are exhausted through the shaft and to the outlet port. In some embodiments, the manifold further comprises an integral outlet conduit and an integral electrical conduit and the inlet port is in fluid communication with the hollow shaft such that carrier gas is distributed from the shaft through an integral gas ring.

Further embodiments comprise a manifold having a base with a top surface and a bottom surface, the bottom surface having a plurality of elongate walls extending therefrom, each of the elongate walls having a plurality of openings with openings in adjacent elongate walls off-set from one another forming a torturous flow path defining a bottom exchange zone, and the top surface also having a plurality of elongate walls extending therefrom defining an upper exchange zone.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figures 1, 2:
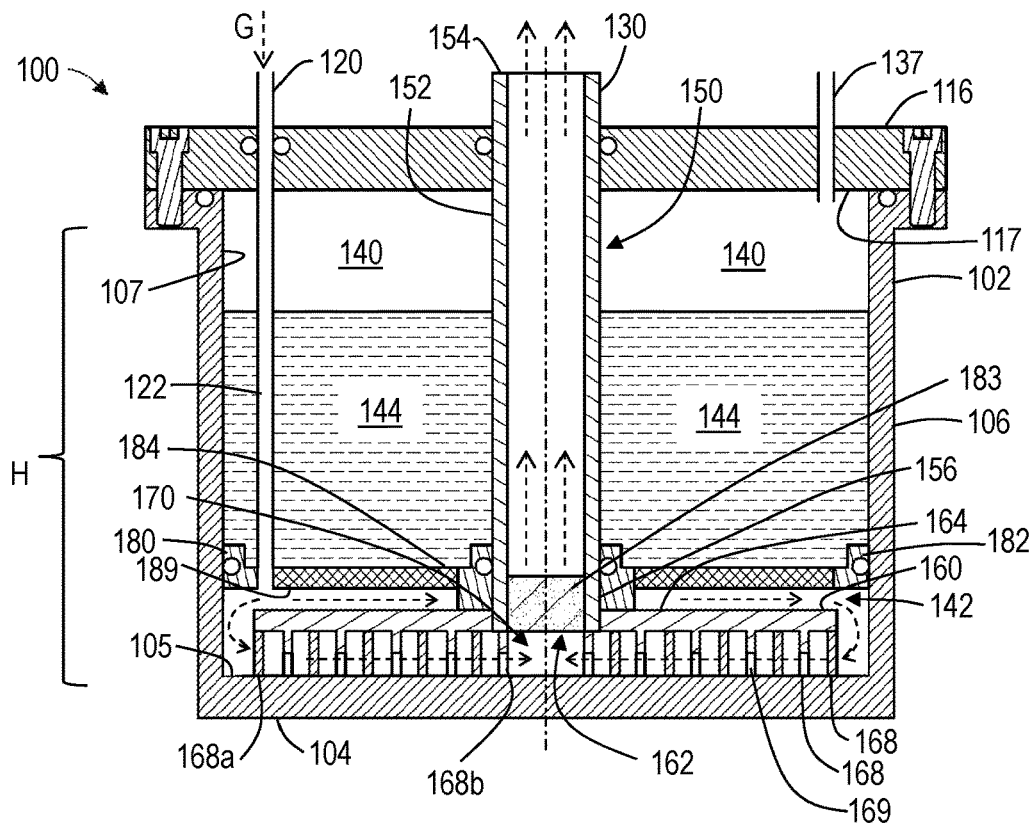
FIG. 1 illustrates a schematic view of an ampoule and accompanying manifold having a torturous flow configuration in accordance with an embodiment of the present disclosure.
FIG. 2 illustrates a schematic view of an ampoule and accompanying manifold having a torturous flow configuration in accordance with an embodiment of the present disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label. The cross-hatch shading of the components in the figures are intended to aid in visualization of different parts and do not necessarily indicate different materials of construction.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

Some embodiments of the disclosure advantageously provide a long flow path for a carrier gas from ampoule inlet to outlet for the delivery of low vapor pressure precursors, e.g., liquid and/or solid source precursor. Low vapor pressure precursors are understood to refer to materials that do not readily vaporize under atmospheric conditions. Low vapor pressure precursors typically have a vapor pressure of less than 10 Torr, and more typically less than 1 Torr. In some applications, a carrier gas is used to deliver low vapor pressure material from an ampoule to a reactor. Low vapor pressure materials typically require heat to increase the vapor pressure. A non-limiting list of exemplary precursors includes $ZrCl_4$, $Y(EtCP)_3$, $HfCl_4$, $WCl_5$, $MoCl_5$, $In(CH_3)_3$, and liquid SiIo, $Mg(Cp)_2$.

A flow path having a long and torturous distance allows the carrier gas adequate residence time to become partially to nearly to fully saturated with vaporized and/or sublimed and/or entrained precursor. As used herein, the term "torturous path" means a flow path that has multiple branches, curves, angles, turns, etc., that prevent a straight path for the flow. In some embodiments, the torturous path increases the residence time of the gas within the manifold to increase concentration uniformity. Reference herein to "saturated" allows for varying degrees of saturation.

Some embodiments of the disclosure advantageously provide bottom-fed ampoule configurations. Some embodiments advantageously provide ampoules in which depletion of the solid precursor does not affect the concentration of the saturated carrier gas.

Some embodiments provide apparatus and methods for heating low vapor pressure precursors in large volume ampoules, including ways to provide effective uniform heating of the precursors. Some specific embodiments advantageously retain low vapor pressure precursors, including solid precursor dust, within a cavity of the vessel, not allowing it to migrate upstream or downstream to control valves by means of filter media. Some embodiments advantageously control uneven depletion of the precursor. Some embodiments advantageously provide even distribution of the carrier gas along the entire surface of a precursor bed in a bottom-fed configuration. Embodiments herein provide improved doses of the precursor.

In some embodiments, the ampoules comprise a removable manifold having a plurality of elongate walls defining a labyrinth such that the flow path is tortuous. Advantageously, one or more embodiments provide a flow path whose distance can be five to ten times longer than distances found with common ampoules, in particular solid source sublimation vessels. The increased flow path allows for a longer dwell time of carrier gas and vaporized precursor chemistry to mix within the ampoule.

Ampoules disclosed herein comprise a container defining a cavity configured to hold a precursor; an inlet port and an outlet port, both in fluid communication with the cavity; and a removable manifold having a serpentine base. The serpentine base comprises a plurality of elongate walls arranged to define torturous flow channels (also referred to a "serpentine path"), each of the elongate walls comprising a plurality of openings opening. A flow path is defined by the flow channels and the plurality of openings, through which a carrier gas flows in contact with the precursor. In some embodiments, the serpentine base comprises a plurality of top elongate walls extending from a top surface of the serpentine base and a plurality of bottom elongate walls extending from a bottom surface of the serpentine base. The plurality of top elongate wall and plurality of bottom elongate walls each define torturous flow paths such that the dwell time of the carrier gas and vaporized precursor chemistry is increased within the ampoule. In one or more embodiments, the flow path travels from an outermost channel to an innermost channel, which may be referred to as an "outer-to-inner flow" configuration. In one or more embodiments, the flow path travels from an innermost channel to an outermost channel, which may be referred to as an "inner-to-outer flow" configuration. In some embodiments, carrier gas has an inner-to-outer flow through the plurality of top elongate walls and subsequently has an outer-to-inner flow through the plurality of bottom elongate walls.

Ampoules disclosed herein are in a bottom-fed configuration such that the precursor is separated from a lower chamber by a sublimation bed. In such a configuration, the lower chamber maintains a constant volume as precursor resting above the sublimation bed is depleted as carrier gas passes across the one or more filter media. The lower chamber of the ampoule is separated into an upper exchange zone and a lower exchange zone. The upper exchange zone is a volume between the sublimation bed and the top surface of the serpentine base, and the lower exchange zone is a volume between the bottom surface of the serpentine base and the inner surface of the bottom wall of the container. Each upper exchange zone and lower exchange zone is configured to increase the dwell time of carrier gas and vaporized precursor chemistry to mix within the ampoule.

Carrier gas passes across the sublimation bed in the upper exchange zone where the precursor chemistry and the carrier gas flow to form a saturated gas mixture of precursor and carrier gas. Carrier gas is streamed directly across the filter media in order to saturate the carrier gas with precursor particles. In some embodiments, the carrier gas flows through a torturous path positioned within the upper exchange zone. The torturous path is configured to increase the duration in which the carrier gas is interacting with precursor chemistry within the upper exchange zone. While still within the lower chamber, the saturated gas then passes through a "lower exchange zone" also comprising a torturous path before exiting the lower chamber and the ampoule. In some embodiments, the filter media comprises a mesh with a pore size sufficient to prevent solid precursor from passing through.

In some embodiments, the manifold is configured to provide an internal heat source for controlling temperature within the ampoule in accordance with precursor sublimation chemistries. In some embodiments, heating elements are disposed on the exterior of the ampoule. In some embodiments, a cable heater is integral or brazed between two plates positioned between the upper and lower exchange zones such that gases flowing within the upper and lower exchange zones are heated, promoting both sublimation of the precursor material and saturation of the carrier gas.

Generally, the flow paths provided herein force the carrier gas to flow around a series of elongate walls, which in one or more particular embodiments are nested concentric tubes having one or more plurality of openings passageways, which define flow channels. The gas flow changes direction from flow channel to flow channel until the last flow channel in communication with the outlet port is reached. This change of direction also enhances mixing of the vaporized and/or sublimed precursor with the carrier gas. Plurality of openings allow the carrier gas to flow through into the next flow channel creating a torturous path. As the carrier gas passes from an inlet through the upper exchange zone, lower exchange zone and through the outlet, pure carrier gas becomes partially saturated and then fully saturated with precursor chemistry before exiting through the outlet.

Reference herein to gas flow includes the carrier gas alone or in combination with entrained and/or vaporized and/or sublimed precursor. The flow paths of the upper and lower exchange zones described herein, for example, in FIGS. 5A, 5B, 5C, 9A, 9B and 11, comprise a series of elongate walls, tubular or otherwise, with plurality of openings configured to define flow channels therebetween will result in a desired flow path. In some embodiments, the plurality of openings are off-set to ensure no flow channels are bypassed. Such a configuration is referred throughout the disclosure as "serpentine path" or "torturous path" interchangeably.

FIGS. 1 through 3A illustrate schematic representations of an ampoule and an accompanying manifold having a bottom fed configuration in accordance with embodiments of the present disclosure. Similarly, FIGS. 4, 6, 7, 9A and 9B illustrate side views and perspective views of the ampoule and the accompanying manifold. FIG. 3B illustrates a side view of a filter media in accordance with an embodiment of the present disclosure. FIGS. 4 through 11 illustrate an ampoule and an accompanying manifold with FIGS. 5A-5C, 8, 10 and 11 illustrating the manifold in accordance with embodiments of the present disclosure. An ampoule having a manifold are suitable for use with semiconductor manufacturing raw materials, which include reagents and precursors. In the embodiments shown, the precursor is suspended above a sublimation bed having a filter media. The general region below the sublimation bed is characterized as a lower chamber in which saturation of the carrier gas occurs. Pure or unsaturated carrier gas first passes from the manifold across the sublimation bed of the upper exchange zone where the precursor chemistry and the carrier gas flow to form a saturated gas mixture of precursor and carrier gas. While still within the lower chamber, the saturated gas then passes through a lower exchange zone also comprising a torturous path before exiting the lower chamber and the ampoule. The term "precursor" is used to describe the contents of the ampoule and refers to any reagent that flows into a process environment.

The ampoule 100 includes a container 102 with a bottom wall 104, sidewalls 106, and a lid 116. An inlet port 120 and outlet port 130 are in fluid communication with a precursor cavity 140 defined by internal walls 107 of the container 102. The inlet port 120 is generally configured to allow a connection to a gas source "G" by way of suitable piping and valve(s) and may have suitable threaded or sealing connections. In one or more embodiments, the gas source "G" is a carrier gas; in one or more embodiments, the carrier gas is inert, such as $N_2$, Ar or He; in one or more embodiments, the carrier gas is not inert, such as $H_2$, provided the carrier gas doesn't react with precursor in vessel. The outlet port 130 is also in fluid communication with the precursor cavity 140. The outlet port 130 is generally configured to be able to connect to a line, including suitable piping and valve(s), to allow the flow of gases, which may include entrained particles, exiting the container 102 to flow to a processing chamber (or other component). The inlet port 120 and the outlet port 130 may have a welded or threaded connection to allow a gas line to be connected. While the embodiments depict one of each an inlet and an outlet port, should a particular application require, multiple inlet ports and outlet ports may be present.

In the figures, a flow path is generally indicated by a series of dashed arrows showing the gas source "G" starting from the inlet port 120 and exiting through the outlet ports 130. In some embodiments, as best shown in FIGS. 4-5, the inlet port 120 and outlet port 130 are integral to the manifold 250 (represented as integral inlet port 246 and an integral outlet port 247 of the manifold 250 which are in fluid communication with inlet port 220 and an outlet port 230 of the lid 216). In some embodiments, as best shown in FIGS. 1-3A, the inlet port 120 is separate from the manifold 150.

As shown in FIG. 1, a height "H" of the precursor cavity 140 defined by the container 102 spans from a bottom surface 117 of the lid 116 to a top surface 105 of the bottom wall 104.

With reference to FIGS. 1-3A, the manifold 150 comprises a hollow cylindrical shaft 152 having a top end 154 and a bottom end 156, and a serpentine base 160 integral to the bottom end 156 of the cylindrical shaft 152. In some embodiments, the cylindrical shaft 152 and serpentine base 160 are a unitary body. In some embodiments, the cylindrical shaft 152 and serpentine base 160 are welded, threaded or otherwise affixed together by conventional means. In the illustrated embodiments, the top end 154 of the manifold 150 functions as the outlet port 130 where sublimed carrier gas exits the manifold 150 and the ampoule 100.

Figure 11:
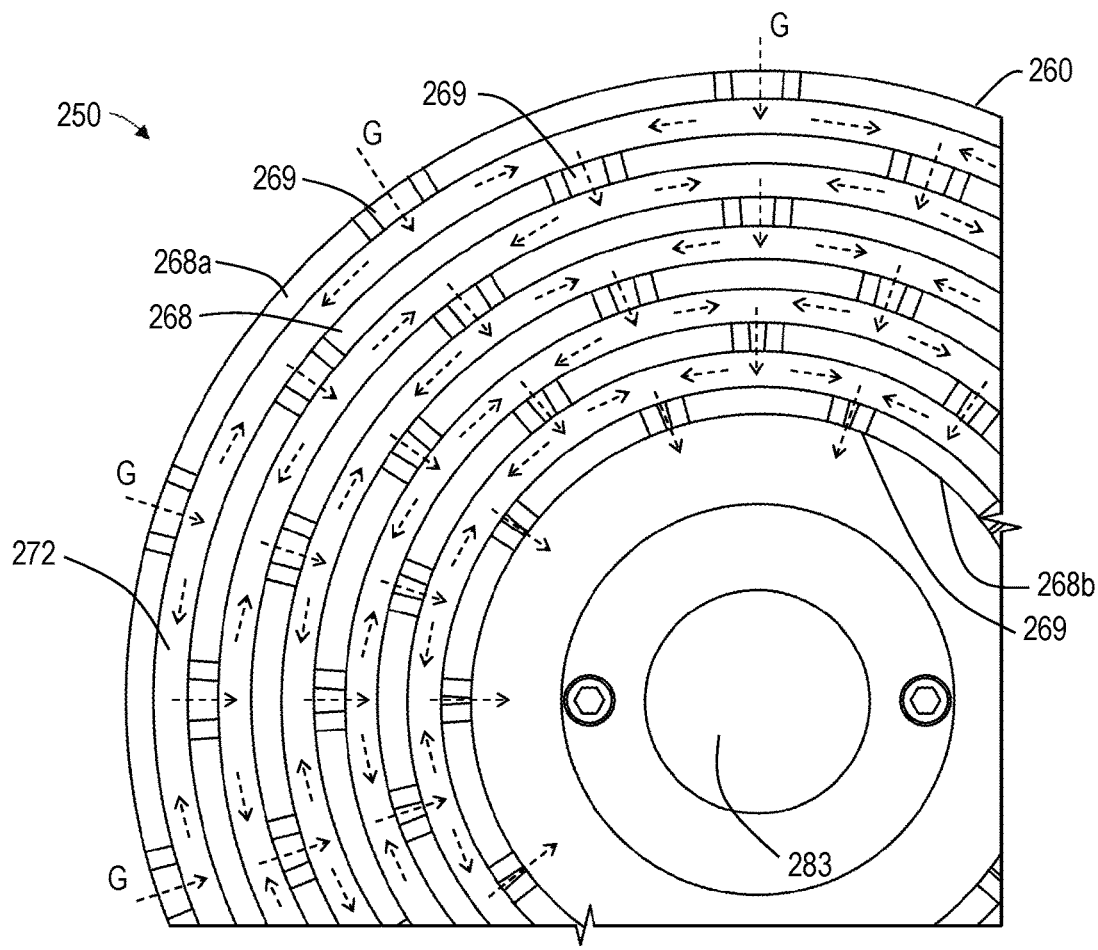

The serpentine base 160 comprises a top surface 164 and a bottom surface 166. From the bottom surface 166 extend a plurality of elongate walls 168 defining a plurality of flow channels 272 (as best shown in FIG. 11). In some embodiments, the elongate walls 168 are in contact with the top surface 105 of the bottom wall 104 of the container 102.

As best shown in FIGS. 3A, 5B, 5C, 10 and 11, The elongate walls (168, 268, 368, 394) each comprise an plurality of openings (169, 269, 369) forming a torturous flow path signified by the arrows in the figures. The elongate walls (168, 268, 368, 394) and the plurality of openings (169, 269, 369) together form a maze-like or "zig-zag" torturous flow path such that not one plurality of openings opening overlaps with another plurality of openings. By way of example, sublimed gas G enters from an plurality of openings (169, 269) of an outermost elongate wall (168a, 268a) and exits from an plurality of openings (169, 269) to an innermost elongate wall 268b. Stated differently, the plurality of openings (169, 269) of any of the elongate walls (168, 268) is offset from an adjacent elongate wall (168, 268).

A flow path of the bottom surface 166 of the serpentine base 160 (the lower exchange zone) is defined as follows: carrier gas G enters through the plurality of openings 169 of the outermost wall (168a, 268a) through subsequent elongate walls (168, 268) until the carrier gas G has reached the plurality of openings 169 of the innermost wall (168b, 268b). As carrier gas G passes through the plurality of openings 169 of the innermost wall (168b, 268b), it enters a central cavity 170 after which the carrier gas G is exhausted, as explained in further detail below. The central cavity 170 is defined by an inner surface of the innermost wall (168b, 268b), the bottom surface 166 of the serpentine base 160 and the top surface 105 of the bottom wall 104 of the container 102.

Figure 3A:
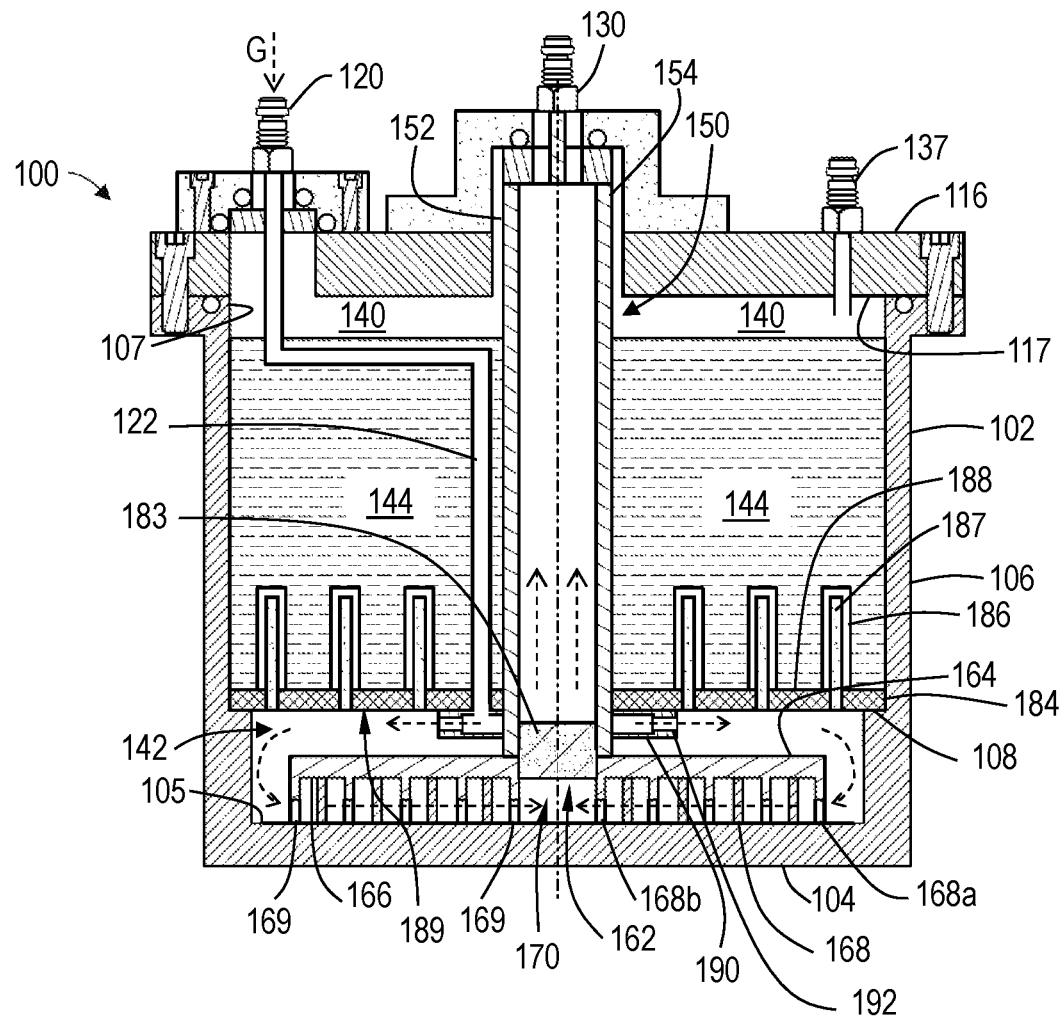
FIG. 3A illustrates a schematic view of an ampoule and accompanying filter media in accordance with an embodiment of the present disclosure.
Figure 3B:
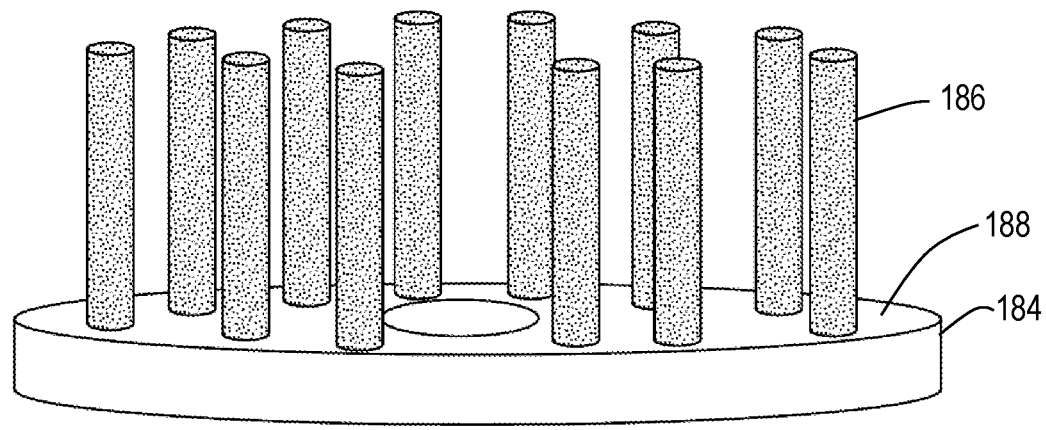
FIG. 3B illustrates a side view of a filter media in accordance with an embodiment of the present disclosure.
Figure 4:
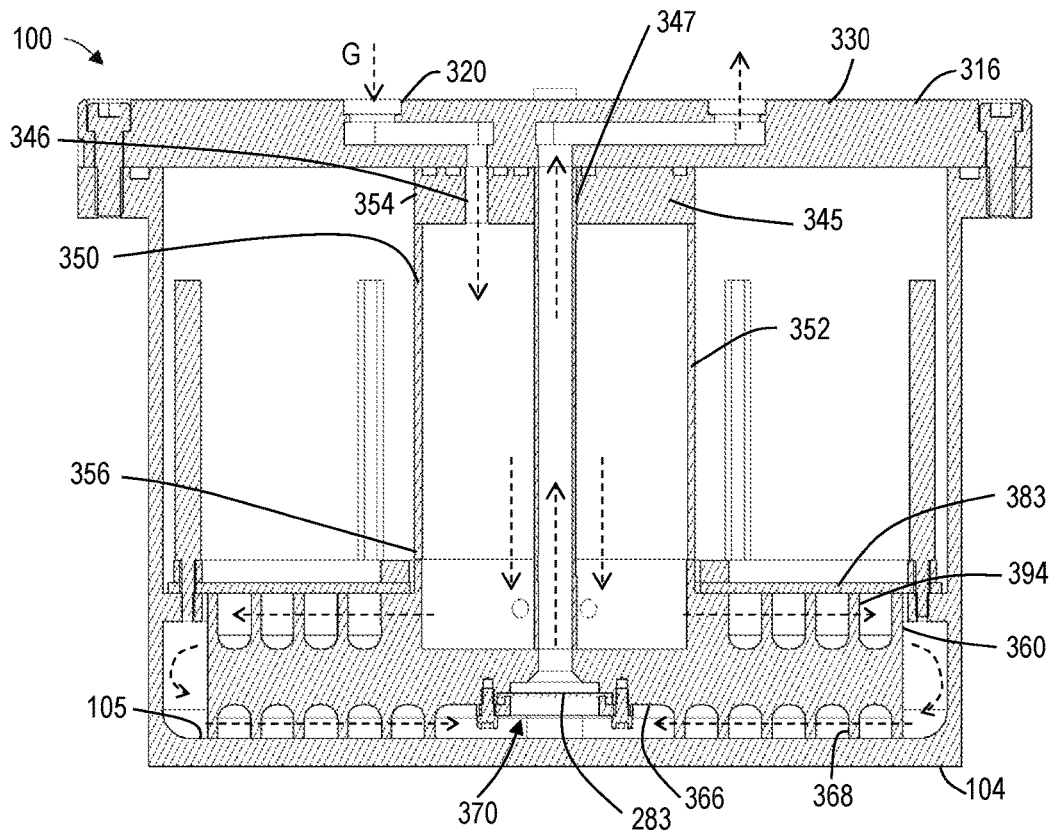
FIG. 4 illustrates a cross-sectional view of an ampoule and accompanying manifold having a torturous flow configuration in accordance with an embodiment of the present disclosure.

As shown in FIGS. 1 and 3A, in some embodiments, the hollow cylindrical shaft 152 is in fluid communication with the central cavity 170 through a centrally located passage 162 of the serpentine base 160. In some embodiments, the passage 162 has a diameter which is substantially equal to an inner diameter of the hollow cylindrical shaft 152 such that gases can have an uninterrupted flow. In some embodiments, as shown in FIG. 2, an outlet conduit 131 of the outlet port 130 is in fluid communication with the central cavity 170. In both embodiments, carrier gas G is exhausted from the central cavity 170 to the outlet port 130.

As shown in FIGS. 1-3A, the ampoule further comprises a filter media assembly 180 (also characterized as a "sublimation bed") comprising a frame 182 and a first filter media 184 in the form of a planar disk. The first filter media 184 is concentric to the hollow cylindrical shaft 152 of the manifold 150. The first filter media 184 has a top surface 188 and bottom surface 189 and has a porosity such that vaporized precursor may pass through but liquid or solid precursor may not. In some embodiments, first filter media 184 has a porosity in the range of 0.2 to 3000 μm, or in the range of 0.5 to 2500 μm, or in the range of 1 to 2000 μm Microns.

The filter media assembly 180 has a planar disk shape and is positioned around the cylindrical shaft 152 of the manifold 150 and the inner walls 107 of the container 102. In particular, the frame 182 which holds the first filter media 184 extends from the cylindrical shaft 152 to the inner walls 107. As shown in FIG. 1, in some embodiments, the frame 182 rests on the top surface 164 of the serpentine base 160. As shown in FIG. 2, in some embodiments, the frame 182 rests on a gas ring 190. As shown in FIG. 3A, in some embodiments, the filter media assembly 180 only consists of a first filter media 184, and the first filter media 184 rests on both the gas ring 190 and an inner ledge 108 of the internal walls 107. In some embodiments, the frame 182 of the filter media assembly 180 is fastened or secured to the inner ledge 108 by an outer retention ring. In some embodiments, the frame 182 of the filter media assembly 180 is fastened or secured to the top surface 164 of the serpentine base 160 by an inner retention ring.

A sublimation cavity 142 is defined by the bottom surface 189 of the first filter media 184 and filter media assembly 180, the bottom end 156 of the cylindrical shaft 152, the internal walls 107 and the top surface 105 of the bottom wall 104 of the container 102. Above the top surface 188 of the filter media, a low vapor pressure material 144 (referred to as a "precursor" or "precursor material") is within the precursor cavity 140, residing above the filter media assembly 180. Space above the material 144 within the precursor cavity 140 is a dead space of the ampoule 100. As the material 144 depletes, the volume of the dead space increases without affecting the concentration of the saturated or partially saturated carrier gas within the lower chamber due to the volume of the lower chamber remaining constant. The material 144 can be a precursor for use with a semiconductor manufacturing process. In one or more embodiments, the material with a low vapor pressure is a solid.

As the ampoule 100 is heated, the material 144 vaporizes creating a saturated vaporized precursor within the precursor cavity 140. As explained in further detail below, as carrier gas passes across the first filter media 184 within the upper exchange zone, it mixes with vaporized precursor material 144 present in the upper exchange zone of the sublimation cavity 142. Heating the ampoule 100 causes the material 144 in intimate or proximate contact with the first filter media 184 to sublime and diffuse across and through the first filter media 184 into the sublimation cavity 142, and in particular the upper exchange zone. The sublimed material 144 saturates the carrier gas after passing through the first filter media 184. In some embodiments, the dead space above the precursor material 144 can contain sublimed material 144 in vapor form.

As shown in FIG. 3A, in some embodiments, the filter media assembly 180 further comprises a plurality of filter cylinders 186 extending from the top surface 188 of the first filter media 184. The filter cylinders 186 are configured to increase surface area of the first filter media 184. In some embodiments, the filter cylinders 186 further comprise an internal conduit 187 extending the length of the filter cylinders 186 such that carrier gas may flow through the filter cylinders 186 thereby increasing the surface area.

In the embodiments shown in FIGS. 1-3A, carrier gas G enters the container 102 from the inlet port 120. The inlet port is in fluid communication with the sublimation cavity 142 by an inlet conduit 122. As shown in FIG. 1, in some embodiments, the inlet conduit 122 is connected to an outer portion of the frame 182. As shown in FIGS. 2 and 3A, in some embodiments, the inlet conduit 122 is connected to a gas ring 190 surrounding the bottom end 156 of the manifold 150. In both configurations, the carrier gas G is directed across the first filter media 184 such that vaporized precursor passing through the first filter media 184 is carried and mixed with the carrier gas G.

In some embodiments, the gas ring 190 comprises a ring-shaped body surrounding the bottom end 156 of the manifold. The gas ring 190 includes a ring-shaped internal channel having a plurality of outlet holes 192 configured to expel carrier gas G from the gas ring 190. The gas ring 190 is connected to the inlet port 120 such that carrier gas G from the inlet port 120 is distributed and ejected across the first filter media 184.

A flow path of the entire ampoule 100 is defined as follows: carrier gas G enters the ampoule 100 and is distributed across the filter media 184 via the gas ring 190 of some embodiments, or directly from the inlet conduit 122 of some embodiments. As the carrier gas G enters the sublimation cavity 142 and is distributed across the filter media 184, vaporized precursor which is passing through the first filter media 184 is carried and mixed with the carrier gas G. Due to the diameter of the serpentine base 160 being smaller than the diameter of the inner walls 107 of the container 102, the mixture of carrier gas G and vaporized precursor surrounds the serpentine base 160 and enters through the plurality of openings 169 of the outermost wall (168a, 268a) through subsequent elongate walls (168, 268) until the gases have reached the plurality of openings 169 of the innermost wall (168b, 268b). As the gases pass through the plurality of openings 169 of the innermost wall (168b, 268b), the gas enters a central cavity 170 after which the gases are exhausted.

Because the material 144 is fed through the filter media assembly 180 in a bottom fed configuration, depletion of material 144 does not cause concentration variations within the sublimation cavity 142.

As shown in FIG. 1, in some embodiments, the cylindrical shaft 152 itself is configured as an outlet port, where the gasses are exhausted directly from the central cavity 170. As shown in FIG. 2, in embodiments having the outlet conduit 131 extending through the cylindrical shaft 152, electrical or control wires can be positioned within the cylindrical shaft 152 as gases do not come into contact with the electrical or control wires.

As shown in FIGS. 1-3, in some embodiments, an auxiliary port 137 extends through the lid 170 and is in fluid communication with the central cavity 170. The auxiliary port 137 according to some embodiments is used for purging, charging with inert gas, or for leak testing.

In some embodiments, a fine filter media (183, 283) is positioned within the cylindrical shaft 152 such that fine particles and/or droplets of precursor do not exit the ampoule. In some embodiments, the fine filter media (183, 283) may be any suitable material or configuration or dimensions or media grade offering one or more of the following characteristics: withstands long-term exposure to the precursor, does not introduce a pressure drop that would impede effective delivery of the precursor, pore size to inhibit and/or prevent fine particles and/or droplets of precursor from exiting the ampoule to protect outlet equipment, and pliable to be capable of making a slight seal with the cylindrical shaft. A non-limiting, exemplary porosity of the fine filter media (183, 283) may be greater than or equal to 0.1 micrometers to less than 100 micrometers, and all values and subranges therebetween, as measured by average pore size.

In some embodiments, as best shown in FIG. 2, the ampoule 100 further comprises one or more external heating elements 134 positioned in one or more of the bottom wall 104, the sidewalls 106 and the lid 116. In some embodiments, as best shown in FIG. 2, the manifold 150 further comprises an internal heating element 136 positioned and in contact with the top surface 164 of the serpentine base 160. In some embodiments, a cable heater is integral or brazed between the upper and lower exchange zones such that gases flowing within the upper and lower exchange zones are heated, promoting both sublimation of the precursor material and saturation of the carrier gas. The one or more external heating elements 134 are configured to vaporize the material 144 within the precursor cavity and the internal heating element 136 is configured to heat the serpentine base 160 and the elongate walls 168 to promote sublimation of the vapor precursor and carrier gas G throughout the sublimation cavity 142.

Figure 5A:
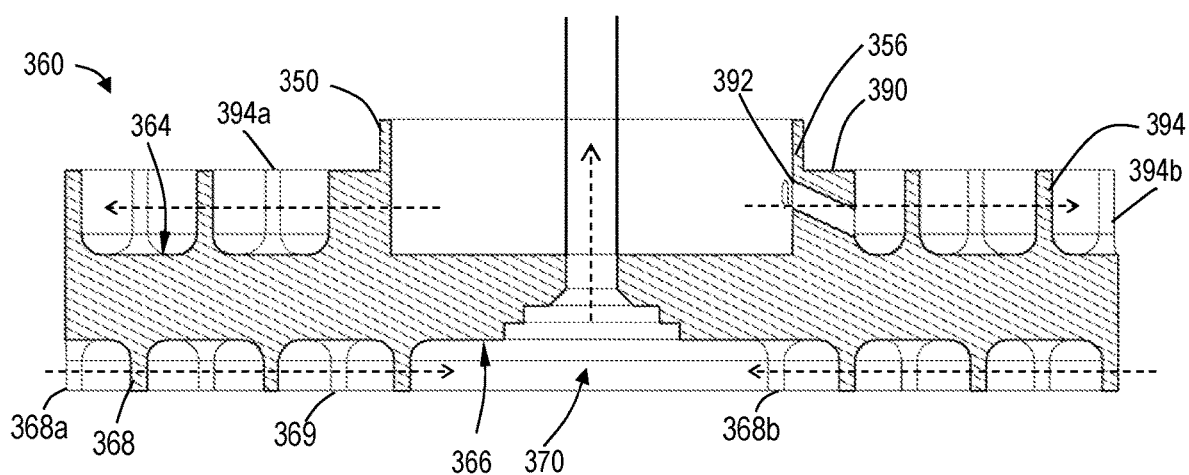
FIG. 5A illustrates a cross-sectional view of a manifold having a torturous flow configuration in both upper and lower exchange zones in accordance with an embodiment of the present disclosure.
Figure 5B:
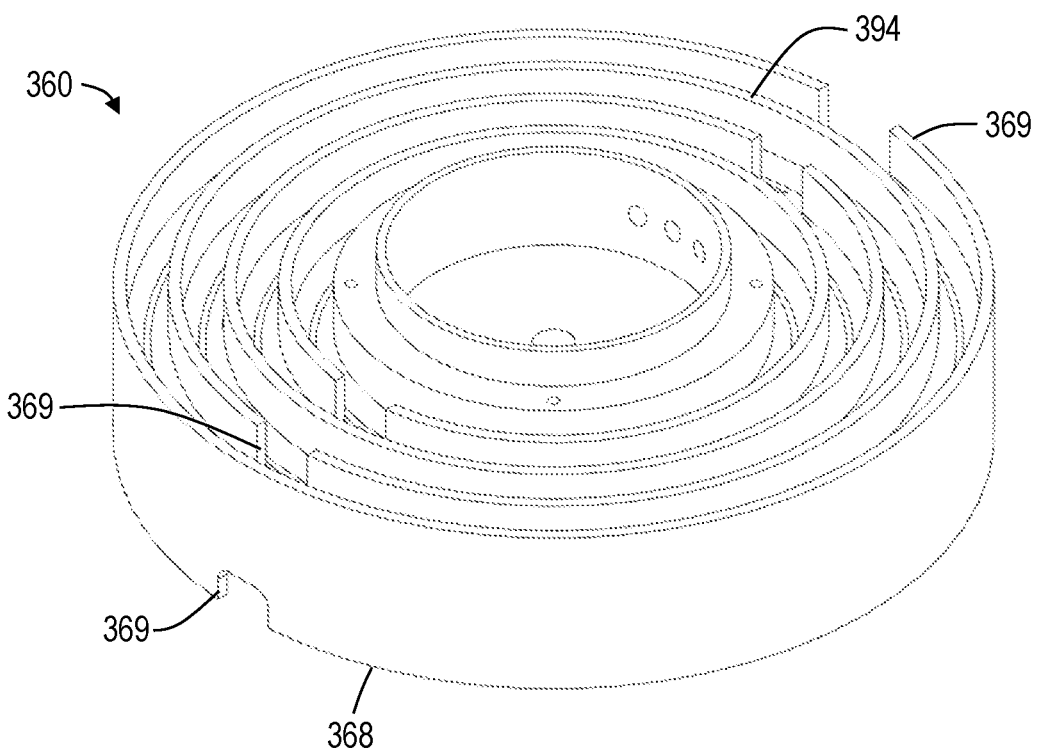
FIG. 5B illustrates a perspective view of a manifold having a torturous flow configuration in both upper and lower exchange zones in accordance with an embodiment of the present disclosure.
Figure 5C:
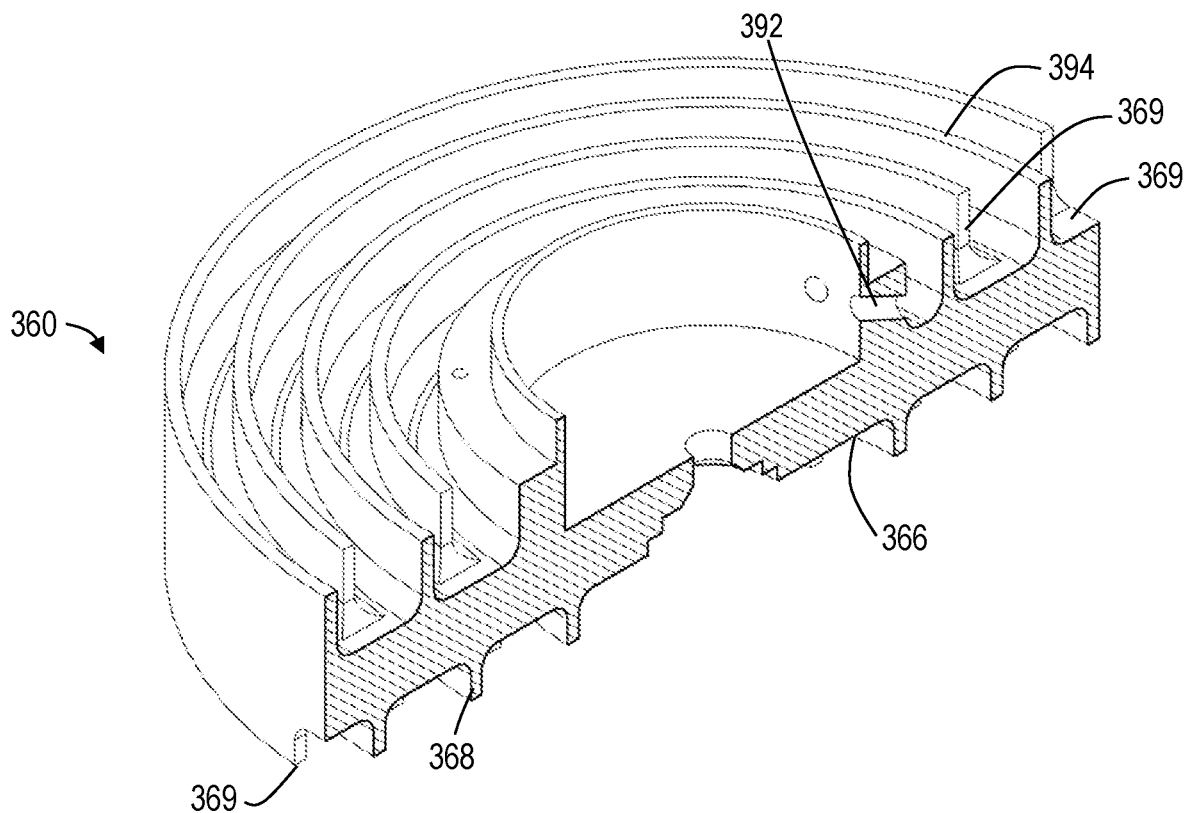
FIG. 5C illustrates a perspective view of a manifold having a torturous flow configuration in both upper and lower exchange zones in accordance with an embodiment of the present disclosure.

FIGS. 4-5C, illustrate a manifold 350 in accordance with one or more embodiments having a plurality of bottom elongate walls 368 extending from a bottom surface 366 of a serpentine base 360 and a plurality of top elongate walls 394 extending from a top surface 364 of the serpentine base 360. The plurality of bottom elongate walls 368 and the plurality of top elongate walls 394 each independently define a plurality of flow channels 272 (as best shown in FIG. 11).

The manifold 350 comprises an integral inlet port 320, outlet port 330 and gas ring 390. The manifold 350 comprises a hollow cylindrical shaft 352 having a top end 354 and a bottom end 356, and the serpentine base 360 integral to the bottom end 356 of the cylindrical shaft 352. In some embodiments, the cylindrical shaft 352 and serpentine base 360 are a unitary body. In some embodiments, the cylindrical shaft 352 and serpentine base 360 are welded, threaded, or otherwise affixed together by conventional means. In the illustrated embodiments, the top end 354 of the manifold 350 comprises a top wall 345 having an integral inlet port 346 and an integral outlet port 347. The integral inlet port 346 and an integral outlet port 347 of the top wall 345 are in fluid communication with an inlet port 320 and an outlet port 330 of the lid 316. The integral outlet port 247 is in fluid communication with the cylindrical shaft 252 itself.

Carrier gas G entering from the inlet port 320 and the integral outlet port 347 passes into the cylindrical shaft 352 and exits across the filter media assembly 380 by way of the integral gas ring 390. As best shown in FIG. 5A, the gas ring 390 is a flange extending outward from the bottom end 356 of the manifold 350. The gas ring 390 further includes a plurality of outlet holes 392 configured to expel carrier gas G from the gas ring 390 across the filter media assembly 380. In some embodiments, the plurality of outlet holes 392 are parallel to the filter media, expelling carrier gas G directly across the filter media.

In the depicted embodiment, the plurality of outlet holes 392 expel carrier gas G into a plurality of openings 369 of an innermost elongate wall 394*a* of the plurality of top elongate walls 394 and through the torturous path formed by the plurality of top elongate walls 394. As the carrier gas G passes through each elongate wall of the plurality of top elongate walls 394, it mixes with vaporized precursor material which is passing through a medium filter media 383. The mixture of carrier gas G and vaporized precursor material exits through a plurality of openings 369 of an outermost elongate wall 394*b*. The mixture of carrier gas G and vaporized precursor surrounds the serpentine base 360 and enters through the plurality of openings 369 of an outermost wall 368*a* through subsequent elongate walls until the gases have reached the plurality of openings 369 of the innermost wall 368*b*. As the gases pass through the plurality of openings 369 of the innermost wall 368*b*, the gas enters a central cavity 370 after which the gases are exhausted.

With reference to FIG. 5A, some embodiments of the disclosure are directed to base 360 for a manifold 350. The base 360 of some embodiments, as illustrated, has a top surface 364 with a plurality of walls with an innermost elongate wall 394*a* and an outermost elongate wall 394*b*. In some embodiments, there are one or more intermediate elongate walls between the innermost elongate wall 394*a* and the outermost elongate wall 394*b* to provide a plurality of concentric channels on the top surface 364 of the base 360. Each of the elongate walls has at least one opening 369 to allow fluid communication between adjacent channels on the top of the base. The base 360 also includes a bottom surface 366 with a plurality of walls with an innermost elongate wall 368*b* and an outermost elongate wall 368*a*. In some embodiments, there are one or more intermediate elongate walls between the innermost elongate wall 368*b* and the outermost elongate wall 368*a* to provide a plurality of concentric channels on the bottom surface 366 of the base 360. Each of the elongate walls has at least one opening 369 to allow fluid communication between adjacent channels on the bottom of the base.

FIGS. 6-10 illustrate a manifold 250 in accordance with one or more embodiments having an integral inlet port 220, outlet port 230 and gas ring 290. The manifold 250 comprises a hollow cylindrical shaft 252 having a top end 254 and a bottom end 256, and a serpentine base 260 integral to the bottom end 256 of the cylindrical shaft 252. In some embodiments, the cylindrical shaft 252 and serpentine base 260 are a unitary body. In some embodiments, the cylindrical shaft 252 and serpentine base 260 are welded, threaded or otherwise affixed together by conventional means.

In the illustrated embodiments, the top end 254 of the manifold 250 comprises a top wall 245 having an integral inlet port 246 and an integral outlet port 247. The integral inlet port 246 and an integral outlet port 247 of the top wall 245 are in fluid communication with an inlet port 220 and an outlet port 230 of the lid 216. The integral outlet port 247 is in fluid communication with the cylindrical shaft 252 itself.

Figure 8:
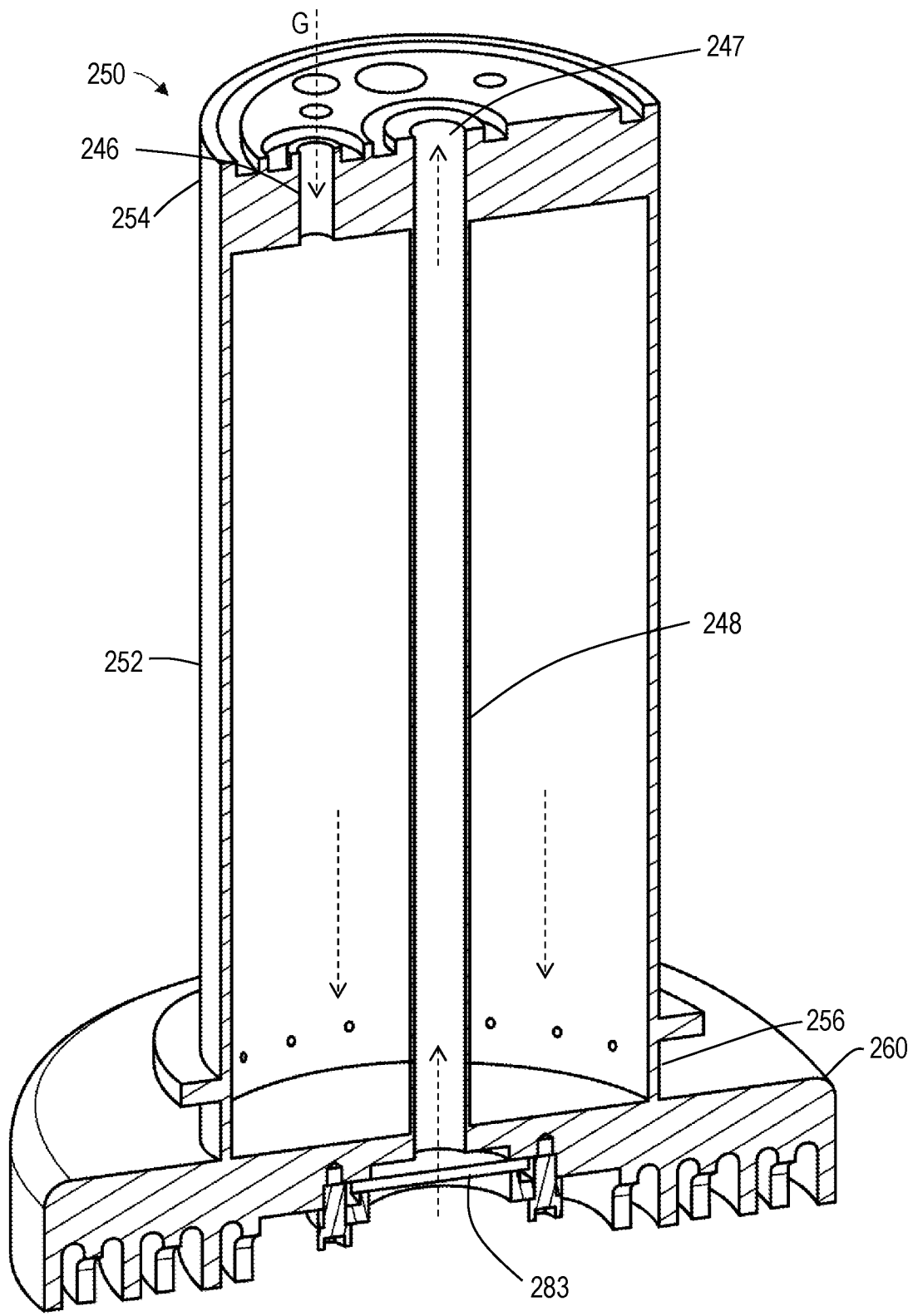
FIG. 8 illustrates an isometric cross-sectional view of a manifold having a torturous flow configuration in accordance with an embodiment of the present disclosure.
Figure 9A:
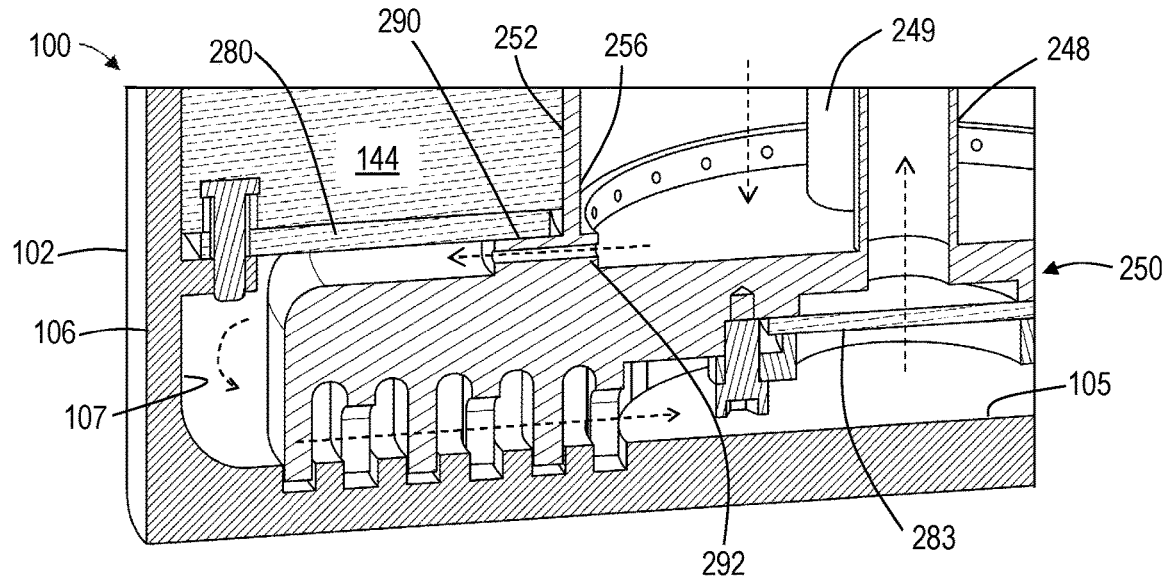
FIG. 9A illustrates a detailed isometric cross-sectional view of an ampoule and accompanying manifold having a torturous flow configuration in accordance with an embodiment of the present disclosure.
Figure 9B:
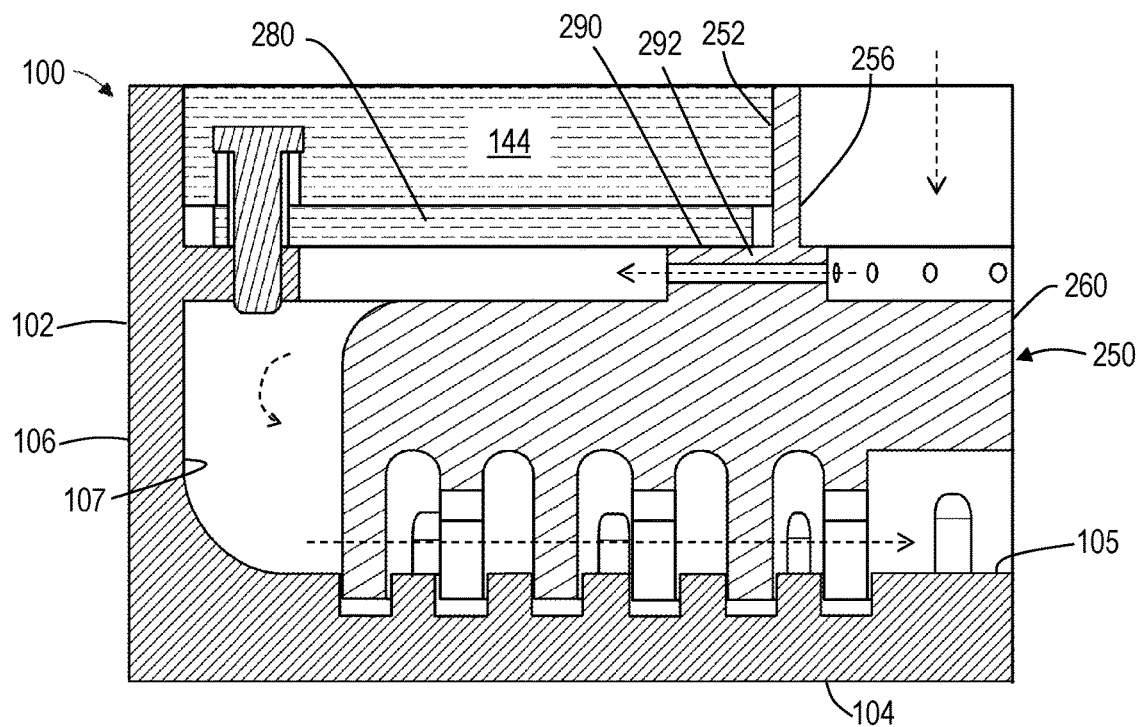
FIG. 9B illustrates a detailed cross-sectional view of an ampoule and accompanying manifold having a torturous flow configuration in accordance with an embodiment of the present disclosure.
Figure 10:
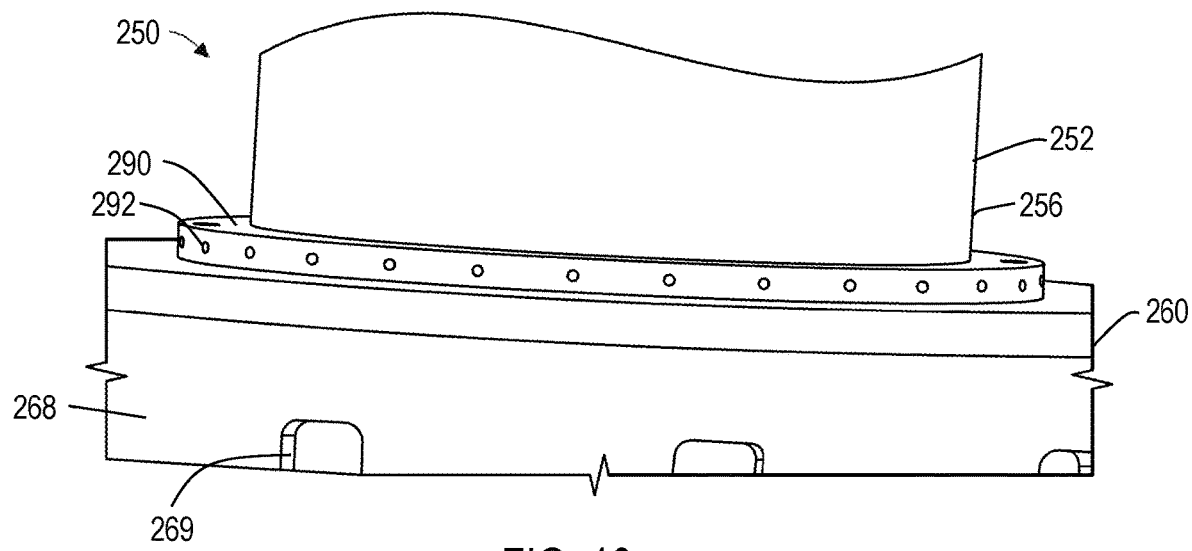
FIG. 10 illustrates a detailed isometric view of a manifold having a torturous flow configuration in accordance with an embodiment of the present disclosure; and, FIG. 11 illustrates a bottom view of a manifold having a torturous flow configuration in accordance with an embodiment of the present disclosure.

Carrier gas G entering from the inlet port 220 and the integral outlet port 247 passes into the cylindrical shaft 252 and exits across the filter media assembly 280 by way of the integral gas ring 290. As best shown in FIGS. 9A, 9B and 8, the gas ring 290 is a flange extending outward from the bottom end 256 of the manifold 250. The gas ring 290 further includes a plurality of outlet holes 292 configured to expel carrier gas G from the gas ring 290 across the filter media assembly 180.

After the vaporized precursor and carrier gas G pass through the serpentine base 260 as previously explained, the gas mixture exits the manifold through an integral outlet conduit 248 which extends from the serpentine base 260 to the integral outlet port 247 and the outlet port 230.

In some embodiments, the manifold further comprises a fine filter media 283 positioned at the integral outlet conduit 248, preventing fine particles and/or droplets of precursor from exiting the ampoule 100. In some embodiments, the fine filter media 283 may be any suitable material or configuration or dimensions or media grade offering one or more of the following characteristics: withstands long-term exposure to the precursor, does not introducing a pressure drop that would impede effective delivery of the precursor, pore size to inhibit and/or prevent fine particles and/or droplets of precursor from exiting the ampoule to protect outlet equipment, and pliable to be capable of making a slight seal with the cylindrical shaft. A non-limiting, exemplary porosity of the fine filter media 283 may be greater than or equal to 0.1 micrometers to less than 100 micrometers, and all values and subranges therebetween, as measured by average pore size.

Figure 6:
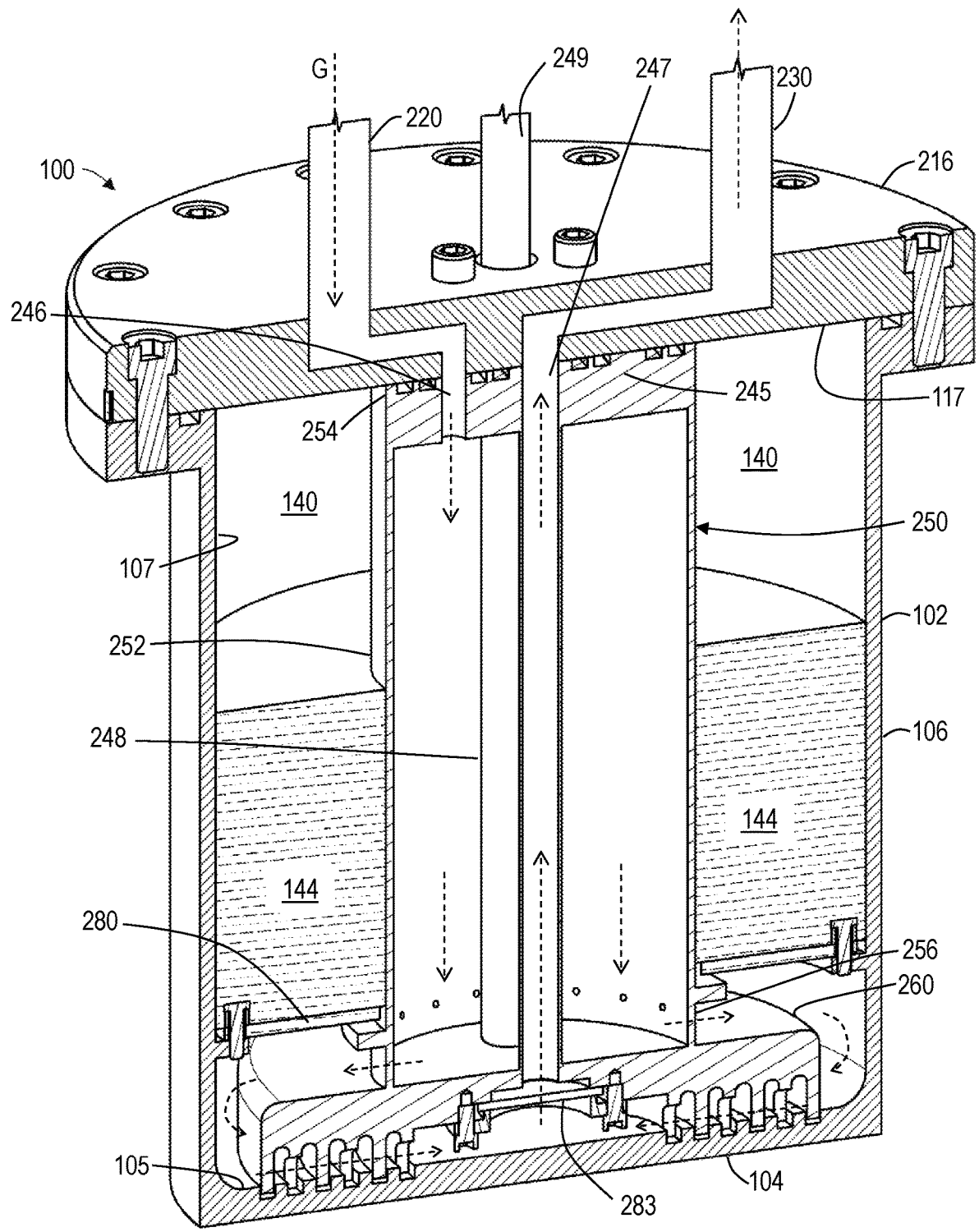
FIG. 6 illustrates an isometric cross-sectional view of an ampoule and accompanying manifold having a torturous flow configuration in accordance with an embodiment of the present disclosure.

In some embodiments, as best shown in FIG. 6, the manifold 250 further comprises an integral electrical conduit 249 extending from serpentine base 260 to an integral conduit port (not shown) of the manifold 250 and an electrical conduit port of the lid 226. In some embodiments, the integral electrical conduit 249 houses signal, electrical or metrology cables.

Where the manifold 250 comprises integral inlet and outlet ports, the entire manifold 250 can be removed for ease of cleaning the ampoule 100. In some embodiments, the manifold 250 is dimensioned to fit within a conventional container ampoule. Thus, the manifold 250 can slide down into position such that the elongate walls 268 come into contact with the bottom wall 104 of the ampoule. An appropriately sized filter media assembly 180 can then be positioned into the container 102 and the lid 216 can seal the container 102. Thus, fastening of gas or electrical conduits is not necessary, reducing assembly time.

In some embodiments, each of the aforementioned structures which come into contact with one another further comprise circular channels for the placement of O-rings or other sealants. In particular, in some embodiments, one or more O-rings is positioned between the filter media assembly 180 and the cylindrical shaft (152, 252), and between the filter media assembly 180 and the sidewalls 106. In some embodiments, O-rings are positioned between the sidewalls 106 and the bottom surface of the lid (116, 216), and between the top wall of the manifold 250) and the bottom surface of the lid 216. In some embodiments, as best shown in FIG. 1, O-rings are positioned between the shaft 152 and an inner surface of an aperture of the lid 116 through which the shaft extends through.

In some embodiments, the ampoule 100 is stored and transported up-side-down such that the material 144 rests on the bottom surface 117 of the lid 116. In such a configuration, damage to the filter media assembly 180 is prevented, and migration of the material 144 through the filter media assembly 180 is prevented.

In some embodiments, components are connected using removable bolts through appropriately shaped openings, which may have a threaded portion to allow for easy connection of a threaded bolt. The bolts can be removed to allow disassembly.

Figure 7:
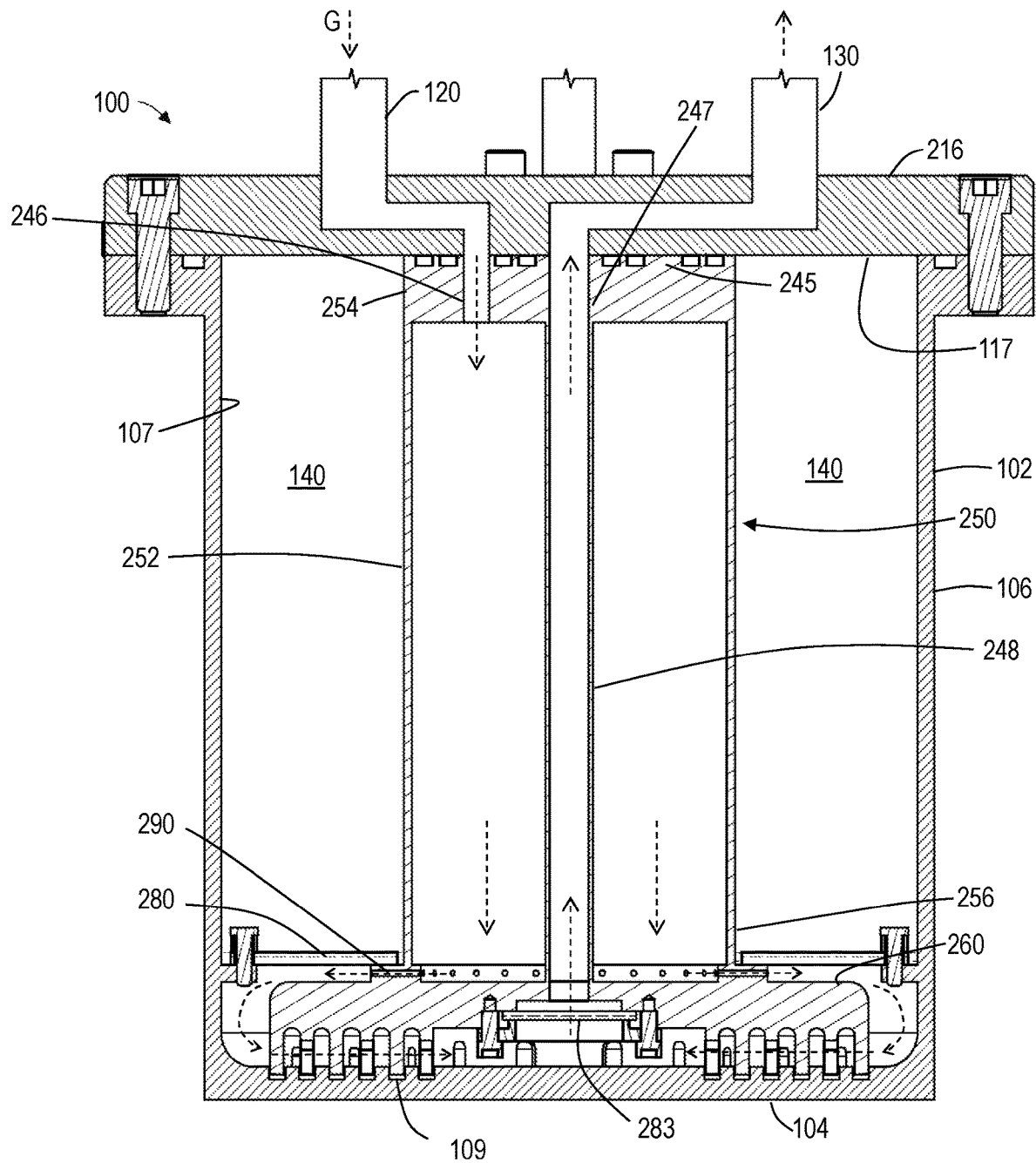
FIG. 7 illustrates a cross-sectional view of an ampoule and accompanying manifold having a torturous flow configuration in accordance with an embodiment of the present disclosure.

In some embodiments, as best shown in FIG. 7, a plurality of grooves 109 are formed in the bottom wall such that the plurality of grooves can interdigitate with the elongate walls 168, forming a seal which prevents passage of gases underneath the elongate walls 168.

According to one or more embodiments, the plurality of openings of any embodiment are suitable to allow carrier gas to flow from one flow channel to another. The plurality of openings may take any suitable shape and/or configuration and/or location along the elongate walls to accommodate flow of entrained and/or saturated carrier gas. Features of the plurality of openings could be a plurality of holes, tapered slots, or other shapes. In one or more embodiments, the plurality of openings are sized and shaped to provide a varying conductance of carrier gas along a longitudinal distance of the container. In one or more embodiments, the plurality of openings opening(s) increase in size in order to increase conductance from the lid toward the bottom wall of the ampoule.

In one or more embodiments, the plurality of openings are notches located at a top end of the elongate walls near the lid. In one or more embodiments, each of the plurality of openings spans a longitudinal distance of greater than or equal to 1-5% to less than or equal to 100% of a length of the wall, including all values and subranges therebetween.

The degree of saturation of conventional ampoules decreases as the solid precursor is consumed due to an increase in volume of the precursor cavity. However, in the embodiments described, because sublimation occurs in the sublimation cavity, which is separated by filter media, the decrease of solid precursor does not affect the degree of saturation, as the volume of the sublimation cavity remains constant. Furthermore, in conventional ampoules, as the precursor is consumed, the gas flow is adjusted during processing to maintain sufficient ratios. However, in the embodiments described the gas flow can remain constant due to the constant volume of the sublimation cavity.

It is understood that the presence of inlet ports, outlet ports and channels/conduits is not limiting and that the number of ports, channels and conduits may be chosen based on space constraints and/or precursor characteristics and/or design need.

In some embodiments, the gas flow across the filter media and through the torturous path is sufficient to entrain and/or vaporize and/or sublime the precursor without a need for bubbling.

Thermocouples, mass flow meters, and pressure gauges may be included in the equipment denoted herein in order to monitor process conditions. In one or more embodiments, a mass flow meter is provided to monitor gas flow into the inlet port. In one or more embodiments, a thermocouple is installed in the bottom wall of the container and at any of the previously disclosed heater locations. In one or more embodiments, a pressure gauge is provided on the inlet line and/or the outlet line. A pressure range within the ampoule in accordance with some embodiments is greater than or equal to 25 torr to less than or equal to 150 torr.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. An ampoule for a semiconductor precursor material, the ampoule comprising:
    a container comprising a bottom wall and sidewalls defining a precursor cavity configured to hold the precursor material, the bottom wall having a top surface;
    a lid having a bottom surface, the bottom surface of the lid in contact with the sidewalls, the lid further having an inlet port and an outlet port extending through the lid;
    a manifold comprising a hollow cylindrical shaft with an outlet and a serpentine base positioned at a bottom end of the shaft, the serpentine base having a top surface and a bottom surface, the bottom surface having a plurality of elongate walls extend therefrom, each of the elongate walls having a plurality of openings, the openings in adjacent elongate walls being off-set from one another forming a torturous flow path;
    a filter media assembly in contact with the bottom end of the shaft forming a sublimation cavity between a bottom surface of the filter media assembly and the top surface of the bottom wall, the sublimation cavity including the bottom end of the shaft and the serpentine base;
    an inlet conduit extending from the lid to the sublimation cavity such that a carrier gas flowing through the inlet conduit passes through the torturous flow path and out the outlet in the hollow cylindrical shaft; and
    a gas ring in fluid communication with the inlet port, the gas ring comprising a plurality of outlet holes configured to allow the carrier gas to pass through the gas ring, the gas ring positioned below the filter media assembly such that the carrier gas is distributed across a bottom surface of the filter media assembly.

2. The ampoule of claim 1, wherein the precursor material is disposed within the precursor cavity, the precursor material resting on the filter media assembly, such that depletion of solid precursor does not cause concentration variations within the sublimation cavity.

3. The ampoule of claim 1, wherein the filter media assembly comprises a first filter media and a frame, the first filter media having a porosity such that vaporized precursor pass through.

4. The ampoule of claim 1, wherein the gas ring is connected to the inlet port by the inlet conduit.

5. The ampoule of claim 1, wherein the gas ring is integral to the bottom end of the shaft.

6. The ampoule of claim 5, wherein the manifold further comprises a top wall having an integral inlet port in fluid communication with the hollow shaft and the gas ring such that the carrier gas pass through the shaft and out of the outlet holes and across the filter media assembly.

7. The ampoule of claim 1, wherein the outlet port is in fluid communication with a central cavity of the serpentine base, the central cavity bounded by an innermost wall of the plurality of walls, and the bottom wall of the container.

8. The ampoule of claim 7, wherein the central cavity is in fluid communication with the outlet port via an outlet conduit.

9. The ampoule of claim 8, wherein the outlet conduit is in fluid communication with an integral outlet port formed in a top wall of the manifold.

10. The ampoule of claim 7, wherein the central cavity is in direct communication with the hollow shaft such that gases are exhausted through the shaft and to the outlet port.

11. The ampoule of claim 7, wherein a fine filter media is positioned within the central cavity, the fine filter media configured to prevent precursor particles from entering the outlet port.

12. The ampoule of claim 1, wherein the precursor material is heated such that a vapor precursor is formed and flows through the filter media assembly and is mixed and sublimed with the carrier gas.

13. The ampoule of claim 1, wherein heating elements are disposed within the serpentine base.

14. The ampoule of claim 1, wherein the manifold further comprises an integral outlet conduit and an integral electrical conduit.

15. The ampoule of claim 14, wherein the inlet port is in fluid communication with the hollow shaft such that the carrier gas is distributed from the shaft through an integral gas ring.

16. An ampoule for a semiconductor precursor material, the ampoule comprising:
- a container comprising a bottom wall and sidewalls defining a precursor cavity configured to hold the precursor material, the bottom wall having a top surface, the sidewall having an inwardly extending ledge spaced a distance from the bottom wall;
- a lid having a bottom surface, the bottom surface of the lid in contact with the sidewalls, the lid further having an inlet port and an outlet port extending through the lid;
- a manifold comprising a hollow cylindrical shaft with an outlet and a serpentine base positioned at a bottom end of the shaft, the serpentine base having a top surface and a bottom surface, the bottom surface having a plurality of elongate walls extend therefrom, each of the elongate walls having a plurality of openings, the openings in adjacent elongate walls being off-set from one another forming a torturous flow path, the serpentine base having a central cavity bounded by an innermost wall of the plurality of walls, the central cavity in fluid communication with the outlet;
- a filter media assembly in contact with the bottom end of the shaft forming a sublimation cavity between a bottom surface of the filter media assembly and the top surface of the bottom wall, the sublimation cavity including the bottom end of the shaft and the serpentine base, the filter media assembly comprising a first filter media and a frame, the first filter media having a porosity such that vaporized precursor pass through, the frame resting on the inwardly extending ledge of the sidewall;
- an inlet conduit extending from the lid to the sublimation cavity such that a carrier gas flowing through the inlet conduit passes through the torturous flow path and out the outlet in the hollow cylindrical shaft; and
- a gas ring in fluid communication with the inlet port, the gas ring comprising a plurality of outlet holes configured to allow the carrier gas to pass through the gas ring, the gas ring positioned below the filter media assembly such that the carrier gas flows across the bottom surface of the filter media assembly, the gas ring connected to the inlet port by the inlet conduit.

* * * * *

UNITED STATES PATENT AND TRADEMARK OFFICE
CERTIFICATE OF CORRECTION

| | |
|---|---|
| PATENT NO. | : 12,054,825 B2 |
| APPLICATION NO. | : 17/355119 |
| DATED | : August 6, 2024 |
| INVENTOR(S) | : Carl White et al. |

It is certified that error appears in the above-identified patent and that said Letters Patent is hereby corrected as shown below:

In the Specification

• Column 4, Line 33, replace "Silo" after "and liquid" and before ", $Mg(Cp)_2$" with "$SiI_4$".

Signed and Sealed this
Fifteenth Day of October, 2024

Katherine Kelly Vidal
*Director of the United States Patent and Trademark Office*